(12) United States Patent
Lv et al.

(10) Patent No.: US 11,907,626 B2
(45) Date of Patent: Feb. 20, 2024

(54) METHOD, DEVICE, AND ELECTRONIC APPARATUS OF INSPECTING DISPLAY PANEL

(71) Applicant: Shenzhen China Star Optoelectronics Semiconductor Display Technology Co., Ltd., Shenzhen (CN)

(72) Inventors: Bo Lv, Shenzhen (CN); Zui Wang, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 16/969,566

(22) PCT Filed: May 13, 2020

(86) PCT No.: PCT/CN2020/089995
§ 371 (c)(1),
(2) Date: Aug. 13, 2020

(87) PCT Pub. No.: WO2021/217725
PCT Pub. Date: Nov. 4, 2021

(65) Prior Publication Data
US 2023/0126876 A1     Apr. 27, 2023

(30) Foreign Application Priority Data
Apr. 27, 2020 (CN) .......................... 202010343882.7

(51) Int. Cl.
*G06F 30/31* (2020.01)

(52) U.S. Cl.
CPC .................... *G06F 30/31* (2020.01)

(58) Field of Classification Search
CPC ........................................................ G06F 30/31
USPC ........................................................ 716/102
See application file for complete search history.

(56) References Cited

U.S. PATENT DOCUMENTS

| 10,380,292 | B1 | 8/2019 | Willis |
| 2004/0164935 | A1* | 8/2004 | Dedene ............... H10K 59/353 |
| | | | 345/75.2 |
| 2008/0284800 | A1 | 11/2008 | Ross |

FOREIGN PATENT DOCUMENTS

| CN | 101178750 A | 5/2008 |
| CN | 102567553 A | 7/2012 |
| CN | 103901684 A | 7/2014 |
| CN | 107369430 A | 11/2017 |
| CN | 107862168 A | 3/2018 |
| CN | 109086476 A | 12/2018 |
| CN | 109299538 A | 2/2019 |

(Continued)

*Primary Examiner* — Eric D Lee
(74) *Attorney, Agent, or Firm* — Nathan & Associates; Menachem Nathan (57) ABSTRACT

A method, a device, and an electronic apparatus are provided. When a user performs the design operation in a display panel design program, the method includes steps of collecting display panel design parameters corresponding to a design operation of the user in the display panel design program obtaining a design strategy preset in the display panel; checking if the display panel design parameters are normal based upon the design strategy of the display panel; and alerting in the display panel design program when the display panel design parameters are abnormal.

18 Claims, 2 Drawing Sheets

(56) References Cited

FOREIGN PATENT DOCUMENTS

JP 2008020797 A 1/2008

* cited by examiner

METHOD, DEVICE, AND ELECTRONIC APPARATUS OF INSPECTING DISPLAY PANEL

FIELD OF INVENTION

The present disclosure relates to a display technical field, and specifically, to a method, a device, and an electronic apparatus of inspecting a display panel.

BACKGROUND OF INVENTION

With the development of display technology, because flat display devices, such as liquid crystal displays (LCDs) and organic light emitting diode displays (OLEDs), have advantages of high image quality, power conservation, thin body and wide application ranges, and so on, they are widely used in mobile phones, TVs, personal digital assistants, digital cameras, notebook computers, desktop computers, and other consumer electronic products, and become the mainstream in display devices.

SUMMARY OF DISCLOSURE

Technical Problem

Generally, in the design process of the display panel, the existing technology mainly relies on human visual inspection of the design drawings. Due to a large number of design specifications, a great amount of manpower is required, and multiple repeated inspections are required. A risk of erroneous inspections easily occurs. Any design error causes the mask to be wasted and decreases the yield rate.

Technical Solutions

Embodiments of the present disclosure provide a method, a device, and an electronic apparatus of inspecting a display panel. The display panel design parameters in the design process of the display panel can be automatically inspected for specifications, checked for design errors, and prompted during the design process of the display panel according to the design strategy. The intelligent inspection in the display panel design process is realized, avoiding manual reviews and repeated reviews, reducing the workload of the design stage of the display panel, and improving the designer's work efficiency To solve above problems, the present disclosure provides technical solutions as follows: To solve above problems, one aspect of the present disclosure provides a method of inspecting a display panel, comprising steps of:

collecting display panel design parameters corresponding to a design operation of a user in a display panel design program when the user performs the design operation in the display panel design program;

obtaining a design strategy preset in the display panel, wherein the design strategy comprises a design strategy of each structure in the display panel, and a correspondence between structures in the display panel;

checking if the display panel design parameters are normal based upon the design strategy of the display panel; and alerting in the display panel design program when the display panel design parameters are abnormal.

In some embodiments of the present disclosure, in the step of collecting display panel design parameters corresponding to a design operation of a user in a display panel design program when the user performs the design operation in the display panel design program, the method comprises steps of:

when the user performs the design operation in the display panel design program, collecting design parameters of an operation target corresponding to the design operation; and collecting a correspondence between the operation target and existing design objects;

wherein the display panel design parameters corresponding to the design operation of the user comprises design parameters of the operation target, and the correspondence between the operation target and the existing design objects.

In some embodiments of the present disclosure, the display panel is a thin film transistor (TFT) liquid crystal display panel, and the design strategy comprises a TFT substrate design strategy, an upper polarizer design strategy, a color filter (CF) substrate design strategy, and a lower polarizer design strategy;

wherein the TFT substrate design strategy comprises specification design parameters of each layer of a TFT substrate, and a correspondence between layers of the TFT substrate; and the CF substrate design strategy comprises specification design parameters of each layer of a CF substrate, and a correspondence between layers of the CF substrate.

In some embodiments of the present disclosure, the TFT substrate design strategy comprises a test terminal design strategy having a test terminal size specification, a distance between a test terminal and a driving chip greater than a default threshold, a distance between the test terminal and a long side of the TFT substrate greater than X, a distance between the test terminal and a short side of the TFT substrate greater than Y, and a spacing between the test terminals greater than Z, wherein X, Y, and Z are positive In some embodiments of the present disclosure, the TFT substrate design strategy further comprises a strategy of material and thickness, a strategy of line width definition and limitation, a strategy of alignment error limitation, and a strategy of TFT process parameters.

In some embodiments of the present disclosure, the strategy of material and thickness comprises information of at least one of materials and thickness of a gate electrode, gate insulating layer, a gate insulating layer, a semiconductor layer, a doped semiconductor layer, a source-drain metal, and a transparent electrode.

In some embodiments of the present disclosure, the strategy of line width definition and limitation comprises information of at least one line width definition and limitation of gate metal lines, semiconductor layer lines, source-drain metal lines, contact holes, and ITO transparent electrodes.

In some embodiments of the present disclosure, the strategy of alignment error limitation comprises information of at least one alignment error limitation between a semiconductor layer and a gate metal, a source-drain metal and a gate metal, a source-drain metal and a semiconductor layer, contact holes and a gate metal, contact holes and a source-drain metal, a transparent electrode and a source-drain metal, a transparent electrode and a gate metal, and a transparent electrode and contact holes.

In some embodiments of the present disclosure, the strategy of TFT process parameters comprises at least one of an electron mobility, a cut-off voltage, a leakage current, and a parasitic capacitance.

In some embodiments of the present disclosure, the display panel is an organic light emitting diode display panel.

In some embodiments of the present disclosure, the method further comprises steps of:

obtaining a new design strategy of the display panel, wherein the new design strategy comprises a design strategy of at least one component of the display panel, or a correspondence between the components of the display panel; and updating the design strategy of the display panel based on the new design strategy.

Another aspect of the present disclosure provides a device of inspecting a display panel, comprising:

a collecting module for collecting display panel design parameters corresponding to a design operation of a user in a display panel design program when the user performs the design operation in the display panel design program;

an obtaining module for obtaining a design strategy preset in the display panel, wherein the design strategy comprises a design strategy of each structure in the display panel, and a correspondence between structures in the display panel;

a checking module for checking if the display panel design parameters are normal based upon the design strategy of the display panel; and an alerting module for alerting in the display panel design program when the display panel design parameters are abnormal.

In some embodiments of the present disclosure, the collecting module is specifically used for:

collecting design parameters of an operation target corresponding to the design operation when the user performs the design operation in the display panel design program; and collecting a correspondence between the operation target and existing design objects wherein the display panel design parameters corresponding to the design operation performed by the user comprises design parameters of the operation target, and a correspondence between the operation target and the existing design objects.

In some embodiments of the present disclosure, the display panel is a thin film transistor (TFT) liquid crystal display panel, and the design strategy comprises a TFT substrate design strategy, an upper polarizer design strategy, a color filter (CF) substrate design strategy, and a lower polarizer design strategy;

wherein the TFT substrate design strategy comprises specification design parameters of each layer of a TFT substrate, and a correspondence between layers of the TFT substrate; and the CF substrate design strategy comprises specification design parameters of each layer of a CF substrate, and a correspondence between layers of the CF substrate.

In some embodiments of the present disclosure, the TFT substrate design strategy comprises a test terminal design strategy having a test terminal size specification, a distance between a test terminal and a driving chip greater than a default threshold, a distance between the test terminal and a long side of the TFT substrate greater than X, a distance between the test terminal and a short side of the TFT substrate greater than Y, and a spacing between the test terminals greater than Z, wherein X, Y, and Z are positive.

In some embodiments of the present disclosure, the TFT substrate design strategy further comprises a strategy of material and thickness, a strategy of line width definition and limitation, a strategy of alignment error limitation, and a strategy of TFT process parameters.

In some embodiments of the present disclosure, the strategy of material and thickness comprises information of at least one of materials and thickness of a gate electrode, gate insulating layer, a gate insulating layer, a semiconductor layer, a doped semiconductor layer, a source-drain metal, and a transparent electrode.

In some embodiments of the present disclosure, the strategy of line width definition and limitation comprises information of at least one line width definition and limitation of gate metal lines, semiconductor layer lines, source-drain metal lines, contact holes, and ITO transparent electrodes.

In some embodiments of the present disclosure, the strategy of alignment error limitation comprises information of at least one alignment error limitation between a semiconductor layer and a gate metal, a source-drain metal and a gate metal, a source-drain metal and a semiconductor layer, contact holes and a gate metal, contact holes and a source-drain metal, a transparent electrode and a source-drain metal, a transparent electrode and a gate metal, and a transparent electrode and contact holes.

In some embodiments of the present disclosure, the strategy of TFT process parameters comprises at least one of an electron mobility, a cut-off voltage, a leakage current, and a parasitic capacitance.

In some embodiments of the present disclosure, the display panel is an organic light emitting diode display panel.

In some embodiments of the present disclosure, the device further comprises an update module for:

obtaining a new design strategy of the display panel, wherein the new design strategy comprises a design strategy of at least one component of the display panel, or a correspondence between the components of the display panel; and updating the design strategy of the display panel based on the new design strategy.

Another aspect of the present disclosure provides an electronic apparatus, comprising:

one or more processors;

a memory; and one or more applications, wherein the one or more applications are stored in the memory and executed by the processors to implement the method of inspecting a display panel.

Beneficial Effect

In the embodiments of the present disclosure, the display panel design parameters in the design process of the display panel can be automatically inspected for specifications, checked for design errors, and prompted during the design process of the display panel according to the design strategy. The intelligent inspection in the display panel design process is realized, avoiding manual reviews and repeated reviews, reducing the workload of the design stage of the display panel, and improving the designer's work efficiency.

BRIEF DESCRIPTION OF DRAWINGS

In order to more clearly illustrate the technical solutions in the embodiment or in the present disclosure, the following drawings, which are intended to be used in the description of the embodiment or of the present disclosure, will be briefly described. It is understood that the drawings described below are merely some embodiments of the present disclosure, and it will be possible to those skilled in the art to obtain other drawings according to these drawings without creative efforts.

FIG. 1 is a first top view showing a display panel of the present disclosure.

DETAILED DESCRIPTION OF PREFERRED EMBODIMENTS

The technical solutions in embodiments of the present disclosure will be described clearly and completely in conjunction with the drawings in the embodiments of the present disclosure. Apparently, the described embodiments are only a part of the embodiments of the present disclosure, but not all of the embodiments. Based on the embodiments in the present disclosure, other embodiments obtained by those skilled in the art without creative work would fall within the protection scope of the present disclosure.

In the description of the present disclosure, it should be understood that the terms "center", "longitudinal", "lateral", "length", "width", "thickness", "upper", "lower", "front", "back", "left", "right", "vertical", "horizontal", "top", "bottom", "inner", "outer", etc., for indicating orientation or position are based on the orientation or position shown in the drawings, which are merely for the convenience of describing the present disclosure and simplifying the description, rather than for indicating or implying that the devices or elements referred to must have a specific orientation or should be constructed and operated with specific position, and thus cannot be understood as a limitation of the present disclosure. Moreover, the terms "first" and "second" are used for description only, and cannot be understood as indicating or implying relative importance, or the number of technical features indicated. Thus, features defined as "first" and "second" may explicitly or implicitly include one or more of the features. In the description of the present disclosure, "multiple" means two or more than two, unless it is specifically defined.

In the present disclosure, the word "exemplary" is used to mean "an example, illustration, or explanation". Any embodiment described as "exemplary" in the present disclosure is not necessarily interpreted as being more preferred or advantageous than other embodiment. In order to enable any person skilled in the art to implement and use this disclosure, the following description is given. In the following description, the details are listed for explanatory purposes. It should be understood that those of ordinary skill in the art may recognize that the present disclosure can be implemented without using these specific details. In other embodiments, well-known structure and processes will not be described in detail to avoid unnecessary details obscuring the description of this disclosure. Therefore, the present disclosure is not intended to be limited to the illustrated embodiments but is consistent with the widest scope of the principals and features disclosed herein.

The present disclosure provides a method, a device, and an electronic apparatus of inspecting a display panel. The following are detailed descriptions.

First, the method of inspecting a display panel according to one embodiment of the present disclosure is introduced. The method of inspecting a display panel is executed in the electronic apparatus. The electronic apparatus may be a desktop terminal or a mobile terminal. The electronic apparatus may be specifically one of a mobile phone, a tablet computer, and a laptop.

Figure 1:
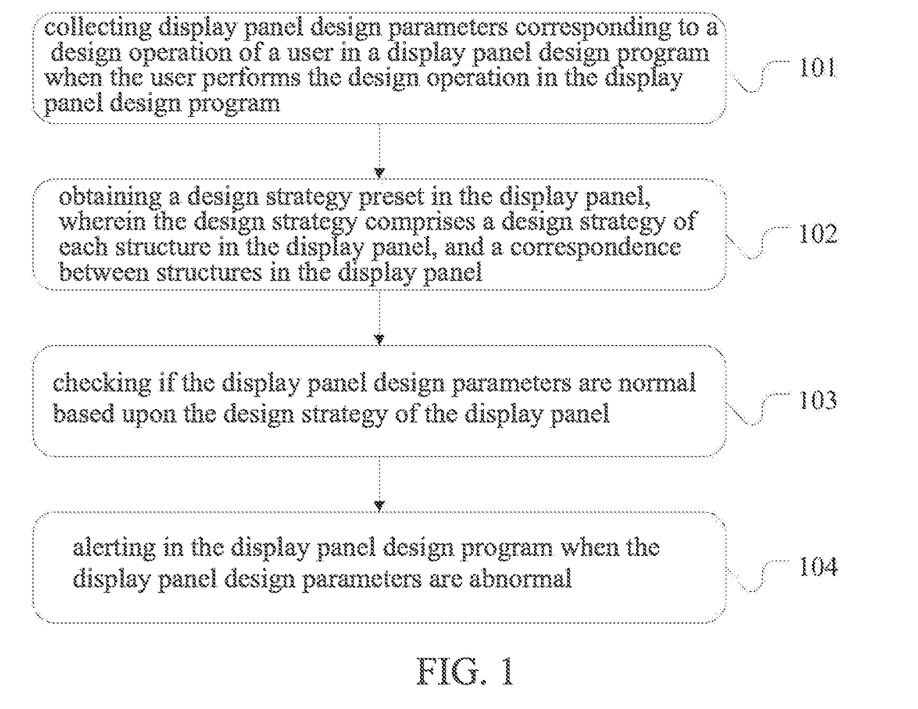
FIG. 1 is a schematic view for showing a flowchart of a method of inspecting a display panel according to one embodiment of the present disclosure.

As shown in FIG. 1, a schematic view of a method of inspecting a display panel according to one embodiment of the present disclosure. The method comprises steps of:

101: collecting display panel design parameters corresponding to a design operation of a user in a display panel design program when the user performs the design operation in the display panel design program.

102: obtaining a design strategy preset in the display panel, wherein the design strategy comprises a design strategy of each structure in the display panel, and a correspondence between structures in the display panel.

103: checking if the display panel design parameters are normal based upon the design strategy of the display panel.

104: alerting in the display panel design program when the display panel design parameters are abnormal.

In the embodiments of the present disclosure, the display panel design parameters in the design process of the display panel can be automatically inspected for specifications, checked for design errors, and prompted during the design process of the display panel according to the design strategy by the device 300 of inspecting a display panel. The intelligent inspection in the display panel design process is realized, avoiding manual reviews and repeated reviews, reducing the workload of the design stage of the display panel, and improving the designer's work efficiency.

In this embodiment, the execution flow of the method of inspecting a display panel may be loaded in the display panel design program in the form of a plug-in, or a display panel inspection program independent of the display panel design program. As long as the display panel design parameters corresponding to the user's current design operation can be collected in the display panel design program, the specific form is not limited here.

It is characterized that the display panel design program may be an electronic design automation (EDA) program of the current display panel design, for example, Protel, Altium Designer, PSPICE, OrCAD, etc.

In some embodiment of the present disclosure, the display panel design parameters corresponding to the design operation of the user may be collected by interface call. For example, a call interface can be pre-defined in the plug-in or the display panel inspection program corresponding to the method of inspecting a display panel to collect the display panel design parameters corresponding to the current design operation of the user in the display panel design program.

It should be noted that the design operation in this embodiment is referred to an operation to perform a design in the display panel design program. Each design operation corresponds to one operation target. For example, the design operations of increasing data lines and increasing terminals correspond to the operation target being data lines and terminals, respectively.

Generally, it is difficult to have a complete definition of the specifications of the display panel because the product specifications are a subjective feeling for consumers, and the specifications of the display panel provided by different manufacturers are different. But for designers, necessarily transforming customer requirements and manufacturer requirements into objective and quantitative data is the design target. That is, the requirements should be converted into designable specifications, namely design specifications (professional specifications). The design strategy preset in one embodiment of the present disclosure is the preset design rules or the preset design specifications of the display panel, so that the design errors which do not comply with the design strategy can be automatically checked when the designer is designing.

Figure 2:
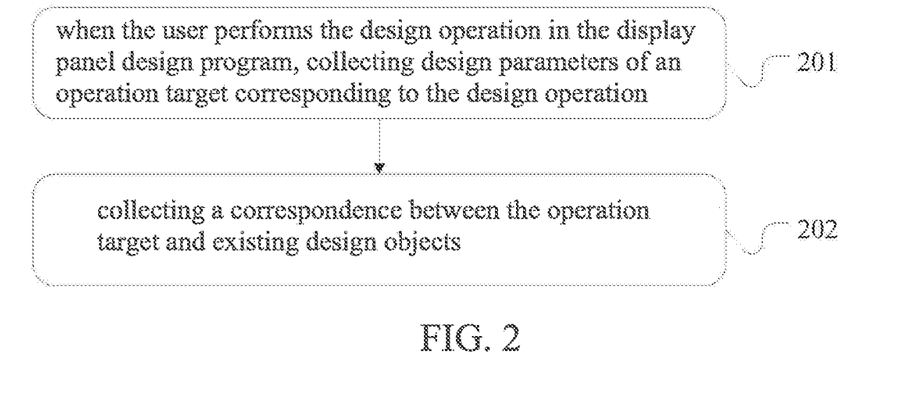
FIG. 2 is a schematic view for showing a step 101 in a flowchart according to one embodiment of the present disclosure.

In some embodiments of the present disclosure, as shown in FIG. 2, in the step of collecting display panel design parameters corresponding to a design operation of a user in a display panel design program when the user performs the design operation in the display panel design program, the above step 101 further comprises steps of:

201: when the user performs the design operation in the display panel design program, collecting design parameters of an operation target corresponding to the design operation.

In one embodiment of the present disclosure, for different types of the operation target, the design parameters to be collected can be designed in advance. For example, the current design operation corresponds to an operation target A, and the preset design parameters B to be collected are collected at this time.

In the specific implementation, assuming that a certain design operation is to add a terminal (pad), the preset design parameter of the pad, such as pad size, etc., can be collected in the design operation for adding the pad.

202: collecting a correspondence between the operation target and existing design objects.

If the current design operation is the first operation of the display panel design process, there may be no existing design objects. At this time, what may be collected in the step 202 is empty. That is, no correspondence data can be collected. If the current design operation is not the first operation of the display panel design process, meanwhile, the operation target corresponding to the design operation and the existing design objects need to meet the preset correspondence. At this time, the correspondence between the operation target and the existing design objects can be collected.

Similarly, take the current design operation as an example of adding a terminal (pad). the design parameters such as the distance between the pad and the long side of the substrate, the distance between the pad and the short side of the substrate, and/or the intervals between the pad and other existing pads (if there are other pads) can be collected.

At this time, the display panel design parameters corresponding to the current design operation of the user comprise design parameters of the operation target, and the correspondence between the operation target and the existing design objects.

It should be noted that the display panel of any embodiment of the present disclosure may be various types of display panels such as a liquid crystal display (LCD) panel, an organic light emitting diode (OLED) panel, etc., specifically, a thin film transistor LCD (TFT-LCD) panel.

In a specific embodiment, the display panel is a TFT-LCD panel. Because the TFT-LCD panel comprises basic components such as a TFT substrate, an upper polarizer, a color filter (CF) substrate, and a lower polarizer, the design strategy comprises a TFT substrate design strategy, an upper polarizer design strategy, a CF substrate design strategy, and a lower polarizer design strategy. It is characterized that the TFT substrate design strategy comprises specification design parameters of each layer of the TFT substrate, and a correspondence between layers of the TFT substrate. The CF substrate design strategy comprises specification design parameters of each layer of the CF substrate, and a correspondence between layers of the CF substrate.

In a specific implementation, for example the test terminal (test pad) of the TFT substrate, the TFT substrate design strategy may comprise a test terminal design strategy having a test terminal size specification, a distance between a test terminal and a driving chip greater than a default threshold, a distance between the test terminal and a long side of the TFT substrate greater than X, a distance between the test terminal and a short side of the TFT substrate greater than Y, and a distance between the test terminals greater than Z, wherein X, Y, and Z are positive.

The following describes the design strategy of the display panel using the TFT-LCD display panel as an example For the TFT-LCD display panel, it contains a lot of knowledge in the professional field, which also involves many professional specifications. These professional specifications are not independent. The design of the display panel is not merely a sum of all specifications. The specifications must coordinate with each other. Clear design goals and positions ensure the final design success of the product.

For the TFT-LCD display panel, the TFT substrate design strategy further comprises a strategy of material and thickness, a strategy of line width definition and limitation, a strategy of alignment error limitation, and a strategy of TFT process parameters.

In one specific implementation, the strategy of material and thickness may comprise information of at least one of materials and thickness of a gate electrode, gate insulating layer, a gate insulating layer, a semiconductor layer, a doped semiconductor layer, a source-drain metal, and a transparent electrode. The strategy of material and thickness may specifically include contents listed in below Table 1. It can be understood that the strategy of material and thickness in Table 1 is merely an example, and more or less material and thickness information may be included in practical applications, which are not limited herein.

TABLE 1

| | material and thickness | |
|---|---|---|
| gate electrode, common electrode metal | MoW, Resistance: 14 μΩ cm, 200 nm | also served as scan lines and common electrode lines |
| gate insulating layer | SiNx, $\varepsilon_r$ = 6.9, t = 360 nm | |
| semiconductor layer | α-Si, μ = 0.3 cm$^2$/ (V · s), t = 100 nm | |
| doped semiconductor layer | heavily doped N-type α-Si t = 50 nm | |
| source-drain metal | Al—Nd, ρ = 4 μΩ · cm t = 600 nm | served as data lines |
| protective insulating layer | SiNx, $\varepsilon_r$ = 6.0, t = 400 nm | |
| transparent electrode | ITO, ρ = 30 μΩ · cm, t = 800 nm thickness error <10% | |

In one specific embodiment, the strategy of line width definition and limitation comprises information of at least one line width definition and limitation of gate metal lines, semiconductor layer lines, source-drain metal lines, contact holes, and ITO transparent electrodes. Specifically, the strategy of line width definition and limitation may include contents listed in below Table 2. It can be understood that the strategy of line width definition and limitation in Table 2 is merely an example, and more or less line width definition and limitation information may be included in practical applications, which are not limited herein.

TABLE 2

| Line width definition and limitation | |
|---|---|
| gate metal lines | Minimum width: 5 μm |
| | Minimum interval: 3.5 μm |
| | Difference between mask size and actual size: (1 ± 0.5) μm |
| semiconductor layer lines | Minimum width: 5 μm |
| | Minimum interval: 4 μm |
| | Difference between mask size and actual size: (1 ± 0.5) μm |
| source-drain metal lines | Minimum width: 7 μm |
| | Minimum interval: 4 μm |
| | Difference between mask size and actual size: (2 ± 1) μm |
| contact holes | Minimum width: 3 μm |
| | Minimum interval: 3 μm |
| | Difference between mask size and actual size: (−1 ± 1) μm |
| ITO transparent electrode | Minimum interval: 3.5 μm |
| | Difference between mask size and actual size: (1 + 1) μm |

In one specific embodiment, the strategy of alignment error limitation comprises information of at least one alignment error limitation between a semiconductor layer and a gate metal, a source-drain metal and a gate metal, a source-drain metal and a semiconductor layer, contact holes and a gate metal, contact holes and a source-drain metal, a transparent electrode and a source-drain metal, a transparent electrode and a gate metal, and a transparent electrode and contact holes. Specifically, the strategy of alignment error limitation may include contents listed in below Table 3. It can be understood that the strategy of alignment error limitation in Table 3 is merely an example, and more or less alignment error limitation information may be included in practical applications, which are not limited herein.

TABLE 3

| alignment error limitation | |
|---|---|
| semiconductor layer vs. gate metal | Minimum length of the gate electrode extending from the semiconductor: 3 μm |
| | Alignment error: 0.6 μm |
| source-drain metal vs. gate metal | Alignment error: 0.6 μm |
| source-drain metal vs. semiconductor layer | Minimum overlap width: 3 μm |
| | Alignment error 1 μm |
| contact holes vs. gate metal | Minimum length of the gate electrode extending from the contact holes: 4 μm |
| | Alignment error: 0.6 μm |
| contact holes vs. source-drain metal | Minimum length of the source-drain extending form the contact holes: 5 μm |
| | Alignment error: 1 μm |
| transparent electrode vs. gate metal | Alignment error: 0.6 μm |
| transparent electrode vs. source-drain metal | Alignment error: 1 μm |
| transparent electrode vs. contact holes | Minimum length of ITO extending from the contact holes: 5 μm |
| | Alignment error: 1 μm |

In one specific embodiment, the strategy of TFT process parameters may comprise at least one of an electron mobility, a cut-off voltage, a leakage current, and a parasitic capacitance. Specifically, the strategy of TFT process parameters may include contents listed in below Table 4. It can be understood that the strategy of TFT process parameters in Table 4 is merely an example, and more or less TFT process parameters may be included in practical applications, which are not limited herein.

TABLE 4

| TFT process parameters | | |
|---|---|---|
| electron mobility | Normal value: 0.15 cm$^2$/(V · s) | |
| cut-off voltage | Max. Value: 1 V Min. Value: −0.5 V | |
| leakage current | less than 0.1 pA/μm | Total leakage current divided by channel width |
| parasitic capacitance | Normal value: 0.17 fF/μm | Total capacitance divided by channel width |

Generally, in order to make the designed display panel meet the requirements of the driving principle in various situations, the design concept is a "worst case design". That is, upon designing, it is considered that the design can be used in extreme cases, and then there is no problem in other situations. For example, if the frame rate of the picture is 60-75 Hz, the charging time is considered at 75 Hz, and the charge retention time is considered at 60 Hz. If the two extreme conditions can be satisfied, other frequencies are definitely satisfied. Therefore, similar principles are used in the embodiments of the present disclosure. In above Table 1 to Table 4, if only a single value is listed, it means that the single value is the worst case design value, and the design value in a better tendency relative to the single value meets the design requirements. For example, the electron mobility of the TFT substrate in Table 4 has a normal value as the design value in the worst situation. Generally, the higher the electron mobility of the TFT substrate, it can indirectly help to improve the resolution of the display. Therefore, the electron mobility greater than the normal value meets the design specifications.

It should be noted that the above Table 1 to Table 4 are merely some examples of strategies in the TFT substrate design strategy. It can be understood that, in addition to the above-described TFT substrate design strategy, in the embodiment of the present application, the design strategy of the display panel may also include any other TFT substrate design strategy according to actual needs, such as the number of the terminals. The design strategy may further include other upper polarizer design strategy, CF substrate design strategy, and lower polarizer design strategy. It is characterized that the upper polarizer design strategy, the CF substrate design strategy, and the lower polarizer design strategy are similar to the TFT substrate design strategy. Refer to the current upper polarizer design specification, the current CF substrate design specification, the current lower polarizer design specification, the TFT substrate design strategy and the actual product requirement to obtain the upper polarizer design strategy, the CF substrate design strategy, and the lower polarizer design strategy, which are not redundantly described in detail in this embodiment of the present disclosure. Any design strategy based on the design specifications can be adopted based on the concept of this disclosure, the specifics of which are not limited herein.

In addition, in the actual application process, different display panel design strategies can be set for different display panels. In order to achieve the optimization of a certain characteristic of the display panel, in the relevant display panel design strategy, optimal design parameters can be adopted. For example, the electron mobility of the TFT substrate is set to be greater than the normal value in Table 4 to indirectly improve the resolution of the display and satisfy the design requirement of the display with higher resolution.

In one embodiment of the present disclosure, after the step 103 of checking if the display panel design parameters are normal based upon the design strategy of the display panel, when the display panel design parameters are abnormal, a step of alerting in the display panel design program is executed. Since the display panel design parameters may include a plurality of design parameters, the display panel design parameters are abnormal if one of the display panel design parameters is abnormal which can be alerted in the display panel design program. The way of alerting can be performed by reporting errors for a specific display panel design parameter that are not normal in the display panel design program.

As the display panel technology has been improved, the design specifications of the display panel have also been updated. Therefore, due to process improvement and design optimization, if the design specifications are updated, the design strategy of the display panel can be updated synchronously. Specifically, in some embodiments of the present disclosure, the method of inspecting a display panel may further comprise steps of: obtaining a new design strategy of the display panel, wherein the new design strategy comprises a design strategy of at least one component of the display panel, or a correspondence between the components of the display panel; and updating the design strategy of the display panel based on the new design strategy. Then, the display panel design parameters corresponding to the user's current design operation in the display panel design program can be collected based on the updated display panel design strategy for inspection.

Figure 3:
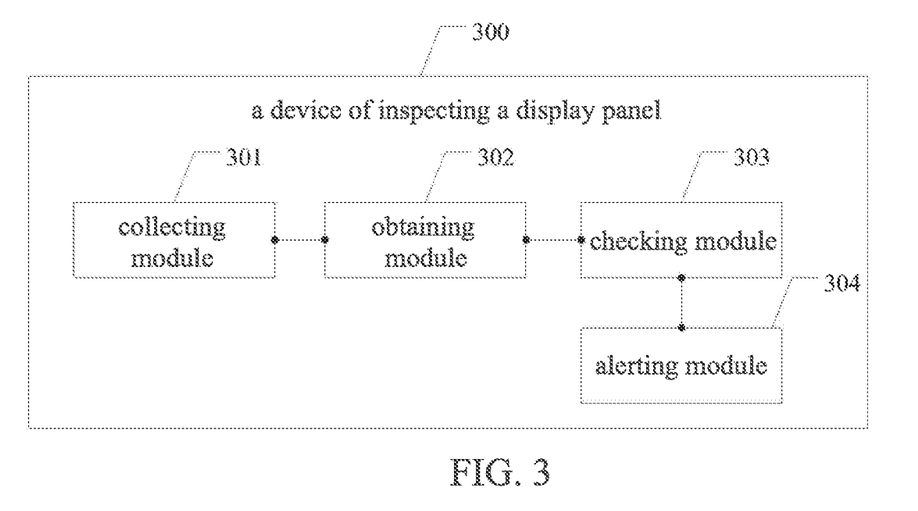
FIG. 3 is a schematic view for showing a device of inspecting a display panel according to one embodiment of the present disclosure.

In order to better implement the method of inspecting a display panel in the embodiment of the present disclosure, an embodiment of the present disclosure further provides a device for inspecting a display panel based on the method of inspecting a display panel as shown in FIG. 3. A device 300 of inspecting a display panel comprises:
- a collecting module 301 for collecting display panel design parameters corresponding to a design operation of a user in a display panel design program when the user performs the design operation in the display panel design program;
- an obtaining module 302 for obtaining a design strategy preset in the display panel, wherein the design strategy comprises a design strategy of each structure in the display panel, and a correspondence between structures in the display panel;
- a checking module 303 for checking if the display panel design parameters are normal based upon the design strategy of the display panel; and
- an alerting module 304 for alerting in the display panel design program when the display panel design parameters are abnormal.

In the embodiments of the present disclosure, the display panel design parameters in the design process of the display panel can be automatically inspected for specifications, checked for design errors, and prompted during the design process of the display panel according to the design strategy by the device 300 of inspecting a display panel. It realizes the intelligent inspection in the display panel design process, avoids manual review and repeated review, reduces the workload of the design stage of the display panel, and improves the designer's work efficiency.

In some embodiments of the present disclosure, the collecting module 301 is specifically used for:
- collecting design parameters of an operation target corresponding to the design operation when the user performs the design operation in the display panel design program; and
- collecting a correspondence between the operation target and existing design objects; wherein
- the display panel design parameters corresponding to the design operation performed by the user comprises design parameters of the operation target, and a correspondence between the operation target and the existing design objects.

In some embodiments of the present disclosure, the display panel is a thin film transistor (TFT) liquid crystal display panel, and the design strategy comprises a TFT substrate design strategy, an upper polarizer design strategy, a color filter (CF) substrate design strategy, and a lower polarizer design strategy; wherein
- the TFT substrate design strategy comprises specification design parameters of each layer of a TFT substrate, and a correspondence between layers of the TFT substrate; and
- the CF substrate design strategy comprises specification design parameters of each layer of a CF substrate, and a correspondence between layers of the CF substrate.

In some embodiments of the present disclosure, the TFT substrate design strategy comprises a test terminal design strategy having a test terminal size specification, a distance between a test terminal and a driving chip greater than a default threshold, a distance between the test terminal and a long side of the TFT substrate greater than X, a distance between the test terminal and a short side of the TFT substrate greater than Y, and a spacing between the test terminals greater than Z, wherein X, Y, and Z are positive.

In some embodiments of the present disclosure, the TFT substrate design strategy further comprises a strategy of material and thickness, a strategy of line width definition and limitation, a strategy of alignment error limitation, and a strategy of TFT process parameters.

In some embodiments of the present disclosure, the device further comprising an update module for:
- obtaining a new design strategy of the display panel, wherein the new design strategy comprises a design strategy of at least one component of the display panel, or a correspondence between the components of the display panel; and
- updating the design strategy of the display panel based on the new design strategy.

The present embodiment further provides an electronic apparatus which integrates any device of inspecting a display panel provided by embodiments of the present disclosure. The electronic apparatus comprises:
- one or more processors;
- a memory; and
- one or more applications, wherein the one or more applications are stored in the memory and executed by the processors to implement steps of the method of inspecting a display panel according to any embodiment mentioned above.

Figure 4:
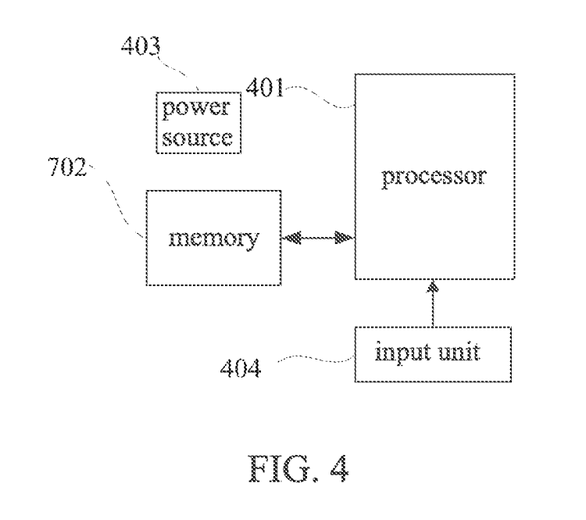
FIG. 4 is a schematic view for showing an electronic apparatus according to one embodiment of the present disclosure.

The present embodiment further provides an electronic apparatus which integrates any device of inspecting a display panel provided by embodiments of the present disclosure. As shown in FIG. 4, a schematic view shows an electronic apparatus according to one embodiment of the present disclosure. Specifically, it is characterized that:
the electronic apparatus may comprises one or more processors 401 with one or more processing core, one or more of memories 402 with computer readable storage medium, a power source 403, and an input unit 404. One of ordinary skill in the art can understood that the electronic apparatus is not limited to the electronic apparatus shown in FIG. 4, and the electronic apparatus may include more or less components than that shown in the drawings. Alternatively, combination or rearrangement of some components of the electronic apparatus is also possible. It is characterized that:

the processor 401 is a control center of the electronic apparatus. The processor 401 uses various interfaces and lines to connect various parts of the entire electronic apparatus, executes various functions of electronic apparatus and processes data by running or executing software programs and/or modules stored in the memory 402 and calling data stored in the memory 402, thereby monitoring the electronic apparatus entirely. Alternatively, the processor 401 may include one or more processing cores. Preferably, the processor 401 may integrate an application processor with a modem processor. It is characterized that the application processor mainly handles the operation system, user interface and application programs, and the modem processor mainly handles wireless communication. It can be understood that the above modem processor may not be integrated into the processor 401.

The memory 402 is configured to store software programs and modules. The processor 401 executes various functions of electronic apparatus and processes data by running the software programs and/or modules stored in the memory 402 and calling data stored in the memory 402. The memory 402 may mainly include a storage program area and a storage data area. It is characterized that the storage program area may store an operation system and application programs required by at least one function (such as sound play function, image play function). The storage data area may store data created based on the use of the electronic apparatus. Additionally, the memory 402 may include high-speed random access memory, and non-volatile memory, for example, at least one disk storage device, flash memory device, or other volatile solid-state storage device. Correspondingly, the memory 402 further include a memory controller to provide the processor 401 to access to the memory 402.

The electronic apparatus further comprises the power source 403 for powering various components. Preferably, the power source 403 may connect logically the processor 401 through a power source management system, thereby achieving the functions of managing charging, discharging, and power consumption by the power source management system. The power source 403 further comprises one or more of DC/AC power sources, a recharge system, a power failure detection circuit, a power converter or inverter, and a power status indicator.

The electronic apparatus further comprises an input unit 404 capable of receiving the input number or character information and generating signal input of keyboard, mouse, joystick, optical or trackball related to users settings and function control.

Although it is not shown, the electronic apparatus may further include a display unit and the like, which will not be repeated here. In this embodiment, specifically, the processors 401 in the electronic apparatus will load the executable file corresponding to the process of one or more application programs into the memory 402 according to the following instructions, and the processor 401 will run the application programs stored in the memory 402 to realize various functions as described below:

when the user performs the design operation in the display panel design program, collecting display panel design parameters corresponding to the design operation of the user in the display panel design program;

obtaining a design strategy preset in the display panel, wherein the design strategy comprises a design strategy of each structure in the display panel, and a correspondence between structures in the display panel;

checking if the display panel design parameters are normal based upon the design strategy of the display panel; and alerting in the display panel design program when the display panel design parameters are abnormal.

Those of ordinary skill in the art may understand that all or part of the steps in the various methods of the above embodiments may be completed by instructions, or by controlling related hardware by instructions. The instructions may be stored in a computer-readable storage medium, loaded and executed by the processor.

Thus, one embodiment of the present disclosure provides a computer readable storage medium comprising a read-only memory (ROM), a random access memory (RAM), disks, or a compact disc (CD) with computer programs stored thereon. The computer programs are loaded by the processor to execute steps of any method of inspecting a display panel provided by the embodiments of the present disclosure. For example, the computer programs is loaded to execute below steps of:

collecting display panel design parameters corresponding to a design operation of a user in a display panel design program when the user performs the design operation in the display panel design program;

obtaining a design strategy preset in the display panel, wherein the design strategy comprises a design strategy of each structure in the display panel, and a correspondence between structures in the display panel;

checking if the display panel design parameters are normal based upon the design strategy of the display panel; and alerting in the display panel design program when the display panel design parameters are abnormal.

In the above embodiments, the description of each embodiment has its own emphasis. For the parts that are not detailed in an embodiment, they can be referred to the detailed descriptions of other embodiments above, which are not repeated here.

In specific implementation, the above units or structures can be implemented as independent entities, or they can be combined in any form and implemented as the same entity or several entities. The specific implementation of the above units can refer to the previous embodiments, and will not be again described herein.

The specific implementation of the above operations can refer to the previous embodiments, and will not be again described herein.

A method, a device, and an electronic apparatus of inspecting a display panel provided in the embodiments of the present disclosure are described in detail above. Specific examples are used for explaining the principles and implementation of the present disclosure. The descriptions of the above embodiments are only for help to understand the method of this disclosure and its core concept. Furthermore, for those skilled in the art, there will be modifications in the specific implementation and application scope according to the concept of this disclosure. In summary, the content of this description should not be understood as a limitation of this disclosure.

What is claimed is:

1. A method of inspecting a display panel, comprising:
collecting display panel design parameters corresponding to a design operation of a user in a display panel design program when the user performs the design operation in the display panel design program;
obtaining a design strategy preset for the display panel, wherein the design strategy comprises a design strategy of each of one or more structures in the display panel, and a correspondence between the structures in the display panel;
checking if the display panel design parameters are normal based upon the design strategy of the display panel; and
alerting in the display panel design program when the display panel design parameters are abnormal,
wherein the display panel is a thin film transistor (TFT) liquid crystal display panel, and the design strategy comprises a TFT substrate design strategy, an upper polarizer design strategy, a color filter (CF) substrate design strategy, and a lower polarizer design strategy;
the TFT substrate design strategy comprises specification design parameters of each of layers of a TFT substrate, and a correspondence between the layers of the TFT substrate; and
the CF substrate design strategy comprises specification design parameters of each of layers of a CF substrate, and a correspondence between the layers of the CF substrate.

2. The method according to claim 1, wherein the collecting of the display panel design parameters comprises:
when the user performs the design operation in the display panel design program, collecting design parameters of an operation target corresponding to the design operation; and
collecting a correspondence between the operation target and existing design objects;
wherein the display panel design parameters corresponding to the design operation of the user comprises the design parameters of the operation target, and the correspondence between the operation target and the existing design objects.

3. The method according to claim 1, wherein the TFT substrate design strategy comprises a test terminal design strategy, and the test terminal design strategy comprises a test terminal size specification, and that a distance between a test terminal and a driving chip is greater than a preset threshold, a distance between the test terminal and a long side of the TFT substrate is greater than X, a distance between the test terminal and a short side of the TFT substrate is greater than Y, and a spacing between test terminals is greater than Z, where X, Y, and Z are positive.

4. The method according to claim 3, wherein the TFT substrate design strategy further comprises a strategy of material and thickness, a strategy of line width definition and limitation, a strategy of alignment error limitation, and a strategy of TFT process parameters.

5. The method according to claim 4, wherein the strategy of material and thickness comprises information of material and thickness of at least one of a gate electrode, a gate insulating layer, a semiconductor layer, a doped semiconductor layer, a source-drain metal, or a transparent electrode.

6. The method according to claim 4, wherein the strategy of line width definition and limitation comprises information of line width definition and limitation of at least one of a gate metal line, a semiconductor layer line, a source-drain metal line, a contact hole, or an ITO transparent electrode.

7. The method according to claim 4, wherein the strategy of alignment error limitation comprises information of at least one of alignment error limitation between a semiconductor layer and a gate metal, alignment error limitation between a source-drain metal and the gate metal, alignment error limitation between the source-drain metal and the semiconductor layer, alignment error limitation between a contact hole and the gate metal, alignment error limitation between the contact hole and the source-drain metal, alignment error limitation between a transparent electrode and the source-drain metal, alignment error limitation between the transparent electrode and the gate metal, or alignment error limitation between the transparent electrode and the contact hole.

8. The method according to claim 4, wherein the strategy of TFT process parameters comprises at least one of an electron mobility, a cut-off voltage, a leakage current, or a parasitic capacitance.

9. The method according to claim 1, further comprising:
obtaining a new design strategy of the display panel, wherein the new design strategy comprises a design strategy of at least one of the structures in the display panel, or a correspondence between at least two of the structures in the display panel; and
updating the design strategy of the display panel based on the new design strategy.

10. A device for inspecting a display panel, comprising:
a collecting module for collecting display panel design parameters corresponding to a design operation of a user in a display panel design program when the user performs the design operation in the display panel design program;
an obtaining module for obtaining a design strategy preset for the display panel, wherein the design strategy comprises a design strategy of each of one or more structures in the display panel, and a correspondence between the structures in the display panel;
a checking module for checking if the display panel design parameters are normal based upon the design strategy of the display panel; and
an alerting module for alerting in the display panel design program when the display panel design parameters are abnormal,
wherein the display panel is a thin film transistor (TFT) liquid crystal display panel, and the design strategy comprises a TFT substrate design strategy, an upper polarizer design strategy, a color filter (CF) substrate design strategy, and a lower polarizer design strategy;
the TFT substrate design strategy comprises specification design parameters of each of layers of a TFT substrate, and a correspondence between the layers of the TFT substrate; and
the CF substrate design strategy comprises specification design parameters of each of layers of a CF substrate, and a correspondence between the layers of the CF substrate.

11. The device according to claim 10, wherein the collecting module is specifically used for:
collecting design parameters of an operation target corresponding to the design operation when the user performs the design operation in the display panel design program; and
collecting a correspondence between the operation target and existing design objects;

wherein the display panel design parameters corresponding to the design operation performed by the user comprises the design parameters of the operation target, and a correspondence between the operation target and the existing design objects.

12. The device according to claim 10, wherein the TFT substrate design strategy comprises a test terminal design strategy, wherein the test terminal design strategy comprises a test terminal size specification, and that a distance between a test terminal and a driving chip is greater than a preset threshold, a distance between the test terminal and a long side of the TFT substrate is greater than X, a distance between the test terminal and a short side of the TFT substrate is greater than Y, and a spacing between test terminals is greater than Z, where X, Y, and Z are positive.

13. The device according to claim 10, wherein the TFT substrate design strategy further comprises a strategy of material and thickness, a strategy of line width definition and limitation, a strategy of alignment error limitation, and a strategy of TFT process parameters.

14. The device according to claim 13, wherein the strategy of material and thickness comprises information of material and thickness of at least one of a gate electrode, a gate insulating layer, a semiconductor layer, a doped semiconductor layer, a source-drain metal, or a transparent electrode.

15. The device according to claim 13, wherein the strategy of line width definition and limitation comprises information of line width definition and limitation of at least one of a gate metal line, a semiconductor layer line, a source-drain metal line, a contact hole, or an ITO transparent electrode.

16. The device according to claim 13, wherein the strategy of alignment error limitation comprises information of at least one of alignment error limitation between a semiconductor layer and a gate metal, alignment error limitation between a source-drain metal and the gate metal, alignment error limitation between the source-drain metal and the semiconductor layer, alignment error limitation between a contact hole and the gate metal, alignment error limitation between the contact hole and the source-drain metal, alignment error limitation between a transparent electrode and the source-drain metal, alignment error limitation between the transparent electrode and the gate metal, or alignment error limitation between the transparent electrode and the contact hole.

17. The device according to claim 10, further comprising an update module for:
obtaining a new design strategy of the display panel, wherein the new design strategy comprises a design strategy of at least one of the structures in the display panel, or a correspondence between at least two of the structures in the display panel; and
updating the design strategy of the display panel based on the new design strategy.

18. An electronic apparatus, comprising:
one or more processors;
a memory; and
one or more applications, wherein the one or more applications are stored in the memory and are executable by the processors to implement a method of inspecting a display panel comprising:
collecting display panel design parameters corresponding to a design operation of a user in a display panel design program when the user performs the design operation in the display panel design program;
obtaining a design strategy preset for the display panel, wherein the design strategy comprises a design strategy of each of one or more structures in the display panel, and a correspondence between the structures in the display panel;
checking if the display panel design parameters are normal based upon the design strategy of the display panel; and
alerting in the display panel design program when the display panel design parameters are abnormal,
wherein the display panel is a thin film transistor (TFT) liquid crystal display panel, and the design strategy comprises a TFT substrate design strategy, an upper polarizer design strategy, a color filter (CF) substrate design strategy, and a lower polarizer design strategy;
the TFT substrate design strategy comprises specification design parameters of each of layers of a TFT substrate, and a correspondence between the layers of the TFT substrate, and
the CF substrate design strategy comprises specification design parameters of each of layers of a CF substrate, and a correspondence between the layers of the CF substrate.

* * * * *